United States Patent
Lee et al.

(10) Patent No.: US 7,650,688 B2
(45) Date of Patent: Jan. 26, 2010

(54) BONDING TOOL FOR MOUNTING SEMICONDUCTOR CHIPS

(75) Inventors: Hee-Bong Lee, Inchon-si (KR); Hyun-Joon Oh, Austin, TX (US)

(73) Assignee: ChipPAC, Inc., Fremont, CA (US)

( * ) Notice: Subject to any disclaimer, the term of this patent is extended or adjusted under 35 U.S.C. 154(b) by 790 days.

(21) Appl. No.: 10/977,047

(22) Filed: Oct. 29, 2004

(65) Prior Publication Data

US 2005/0221582 A1 Oct. 6, 2005

Related U.S. Application Data

(60) Provisional application No. 60/534,049, filed on Dec. 31, 2003.

(51) Int. Cl.
*B23P 19/00* (2006.01)

(52) U.S. Cl. .............................. 29/743; 29/740; 29/741; 29/833; 228/180.21; 294/64.1

(58) Field of Classification Search ........... 29/740–743, 29/840; 156/256, 227; 228/6.1, 13, 180.21, 228/180.22; 294/64.1; 414/737, 752.1; 901/40
See application file for complete search history.

(56) References Cited

U.S. PATENT DOCUMENTS

| | | | | |
|---|---|---|---|---|
| 4,752,180 A | * | 6/1988 | Yoshikawa | ................... 414/737 |
| 5,240,170 A | * | 8/1993 | Nishida et al. | ......... 228/180.21 |
| 5,273,553 A | * | 12/1993 | Hoshi et al. | ................. 29/25.01 |
| 5,348,316 A | * | 9/1994 | Lin | ................ 279/3 |
| 6,463,359 B2 | * | 10/2002 | Fischer | ....................... 700/254 |
| 6,651,866 B2 | * | 11/2003 | Bendat et al. | .................. 228/45 |

FOREIGN PATENT DOCUMENTS

| JP | 61-145893 | * | 7/1986 |
|---|---|---|---|
| JP | 07-66092 | * | 8/1993 |

* cited by examiner

*Primary Examiner*—Minh Trinh
(74) *Attorney, Agent, or Firm*—Robert D. Atkins

(57) ABSTRACT

A vacuum bonding tool for pick-and-place and bonding semiconductor chips onto a substrate or onto a previously mounted die to form a die stack includes a shank and a suction part. The shank has a vacuum conduit extending from a first end to a second end of the shank. The shank is adapted for cooperative engagement with the suction part at the second end, and the shank has a plate at the second end to support the suction part. The suction part has a surface for contacting a semiconductor chip during pick-and place operation. According to the invention, the suction part is made of an elastically deformable conductive or non-conductive material. In various embodiments, the chip contacting surface of the elastically deformable suction part flat overall, or is concave, of has a flat central region and concave regions.

22 Claims, 3 Drawing Sheets

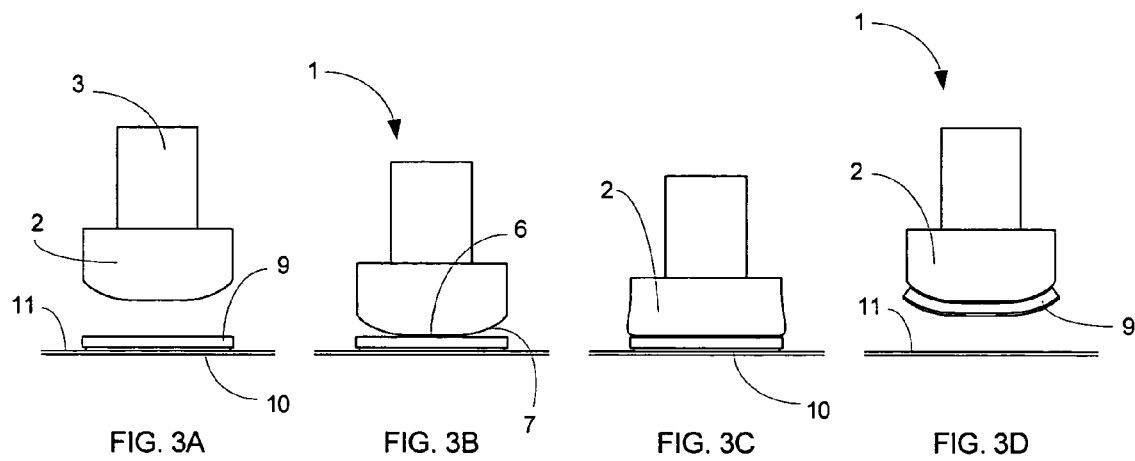
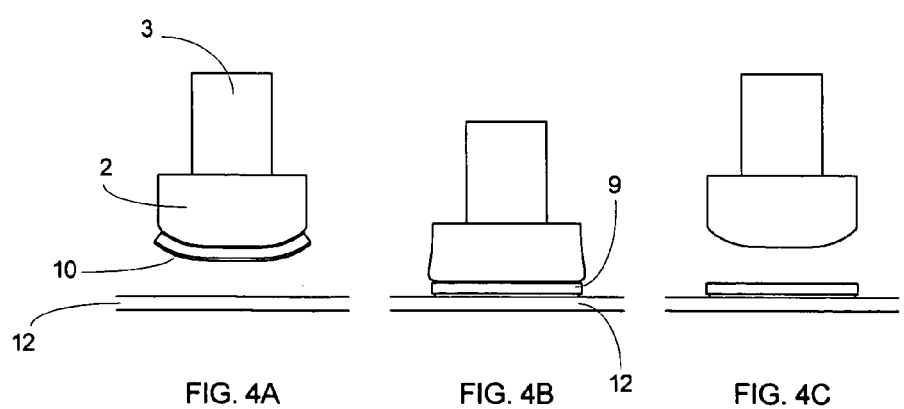

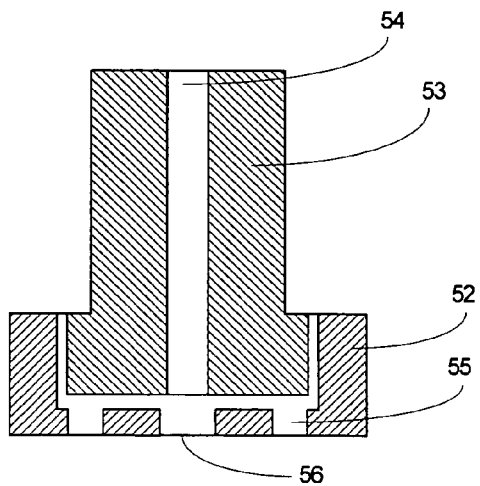
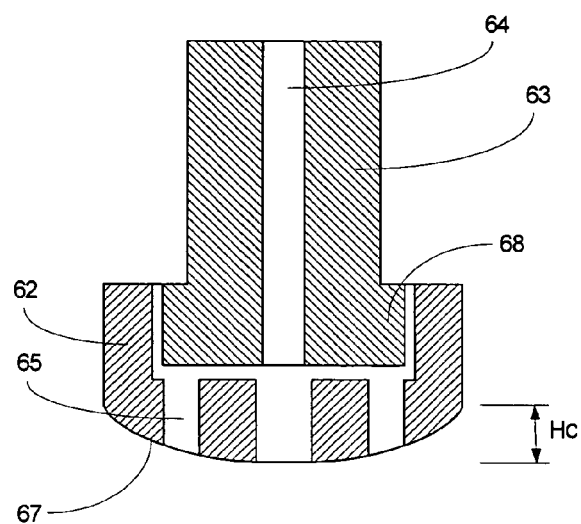
FIG. 5A
FIG. 6A
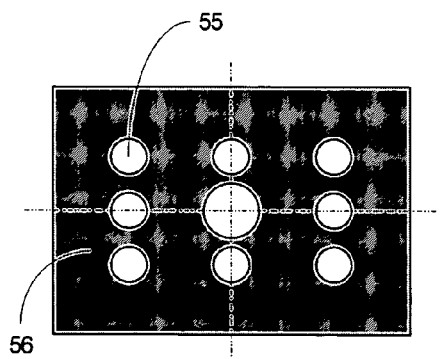
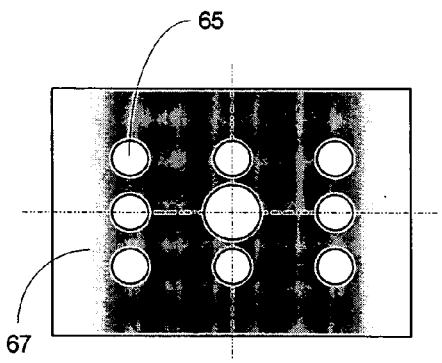
FIG. 5B
FIG. 6B

BONDING TOOL FOR MOUNTING SEMICONDUCTOR CHIPS

CROSS-REFERENCE TO RELATED APPLICATIONS

This application claims priority from U.S. Provisional Application No. 60/534,049, filed Dec. 31, 2003, titled "Bonding tool for mounting semiconductor chips".

BACKGROUND

This invention relates generally to semiconductor chip packaging, and particularly to the process of bonding semiconductor chips to the substrate or to another die, and more specifically to the so-called "die collet", "chip bonding tool" or "pick-up tool" for picking singulated semiconductor die from a wafer and placing the die onto another die or onto a substrate.

In order to obtain maximum function and efficiency in a semiconductor package having minimum dimensions, various approaches have been developed for increasing semiconductor device density in packages. Among the various types of packages are the so-called "multi-chip module", "multi chip package" or "chip stacked package". Some types of multi-chip modules include assemblies of semiconductor devices that are stacked one on top of the other. Stacking semiconductor devices like this can save a large amount of the space in the package.

Wafer dicing is carried out before the chip bonding process. Conventionally, the back of the wafer is coated with a polymer film that provides adhesion between adjacent stacked semiconductor chips or between a chip and a substrate. For stacking semiconductor chips, each chip is lifted by a chip bonding tool, which is typically mounted at the end of a pick-and-place device, and carried to an mounted onto a chip or a substrate under conditions of temperature in a range about 25° C. to about 180° C., and forces in a range about 0.5 N to about 10 N, depending on the chip size and thickness, among other parameters. Such a mounting process is referred to as "film bonding" or as a "pre-coated chip process".

Film bonding has a number of advantageous features, particularly as compared with techniques using a curable adhesive resin for die attach. For example, the thickness of adhesive film is uniform and the adhesive film as applied onto the wafer and subsequently sawn provides an accurately dimensioned adhesive coating over the entire back of the semiconductor chip. Consequently, there is no die tilt, and adhesive voids and adhesive fillet encircling the semiconductor chip are avoided. Moreover, there is no resin bleed, making the process particularly suitable for die stacking and packages with tight design tolerances.

Semiconductor chips are being made increasingly thin in order to decrease the package size. Semiconductor chips having thicknesses approximately 150 um and less can be bent when a conventional pneumatic (suction) chip bonding tool is used to pick-and-place the chip during the chip bonding process. In a film bonding process, when the semiconductor chip is picked by the chip bonding tool, the suction causes the chip to bend owing to the difference between the ambient (atmosphere) pressure and the pressure within the tool created by the vacuum. On placing the semiconductor chip onto a substrate or onto a lower adjacent chip in a chip stack, undesired air bubbles form between the chip being placed and the underlying chip or substrate surface because the bent chip first comes to rest with its edges on the underlying surface. The void formed between the downward facing surface of the chip and the underlying surface of can become sealed so that the trapped air cannot escape. Air trapped in this manner at the adhesion line between die and substrate or between adjacent stacked die degrades the reliability and performance of the package.

SUMMARY

A suction bonding tool for mounting semiconductor chips according to the invention includes a shank and a suction part. The shank has a vacuum conduit extending from a first end to a second end of the shank. The shank is adapted for cooperative engagement with the suction part at the second end, and the shank has a plate at the second end to support the suction part. The suction part has a surface for contacting a semiconductor chip during pick-and place operation. According to the invention, the region of the suction part adjacent the chip contacting surface (the deformable zone) is made of an elastically deformable conductive or non-conductive material.

In some embodiments at least a portion of the chip contacting surface has a plurality of openings which are in pneumatic communication with the vacuum conduit; in some such embodiments the openings a distributed over the contacting surface.

In some embodiments a center region of the chip contacting surface is substantially flat, and regions lateral to the center region of the chip contacting surface are convex. In some such embodiments the substantially flat region of the surface has at least one opening, usually more than one opening, for example three openings; and in some such embodiments each of the convex regions of the surface has at least one opening, usually more than one opening, for example three openings, and the openings are distributed over each convex region; and in some embodiments the openings are distributed over each respective region, and preferably are distributed in an ordered pattern, most preferably evenly distributed, for example evenly spaced apart in a row; preferably at least one opening is located at the centerline of each convex region of the chip contacting surface, and additional openings are arranged symmetrically in relation to the centrally located opening.

In some embodiments the chip contacting surface is substantially flat, having no convex region. In some such embodiments the surface has at least one opening, usually more than one opening; in some embodiments the openings are distributed over the chip contacting surface, and preferably are distributed in an ordered pattern, most preferably evenly distributed. In some embodiments the chip contacting surface has an array of openings, such as nine openings, for example in three rows of three openings each.

In some embodiments the chip contacting surface is convex, having no flat region. In some such embodiments the surface has at least one opening, usually more than one opening; in some embodiments the openings are distributed over the chip contacting surface, and preferably are distributed in an ordered pattern, most preferably evenly distributed. In some embodiments the chip contacting surface has an array of openings, such as nine openings, for example in three rows of three openings each; preferably at least one opening is located at the centerline of the convex surface, and additional openings are arranged symmetrically in relation to the centrally located opening.

BRIEF DESCRIPTION OF THE DRAWINGS

FIGS. 3A-3D are diagrammatic sketches in sectional view showing steps in a process for picking up a semiconductor chip using a bonding tool according to the invention.

FIGS. 4A-4C are diagrammatic sketches in sectional view showing steps in a process for mounting a semiconductor chip onto a substrate or onto a previously mounted chip using a bonding tool according to the invention.

FIG. 5A is a diagrammatic sketch in a sectional view of a chip bonding tool according to an aspect of the invention, in which the chip contacting surface is flat overall.

FIG. 5B is a diagrammatic sketch in a plan view showing the chip contacting surface of a bonding tool as in FIG. 5A, having a flat chip contacting surface.

FIG. 6A is a diagrammatic sketch in a sectional view of a chip bonding tool according to an aspect of the invention, in which the chip contacting surface is convex overall.

FIG. 6B is a diagrammatic sketch in a plan view showing the chip contacting surface of a bonding tool as in FIG. 6A, having a convex chip contacting surface.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1:
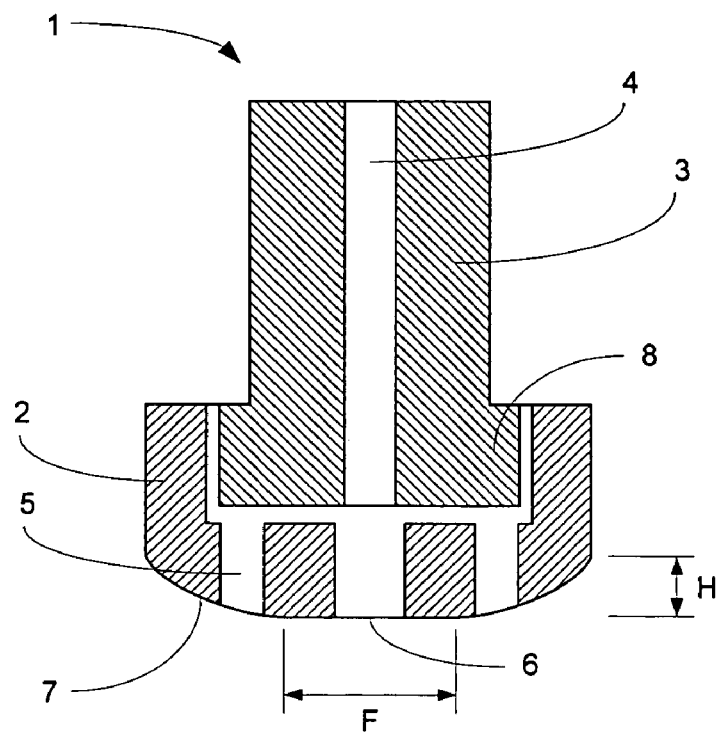
FIG. 1 is a diagrammatic sketch in a sectional view of a chip bonding tool according to an aspect of the invention, in which the chip contacting surface has a flat region and convex regions.
Figure 2:
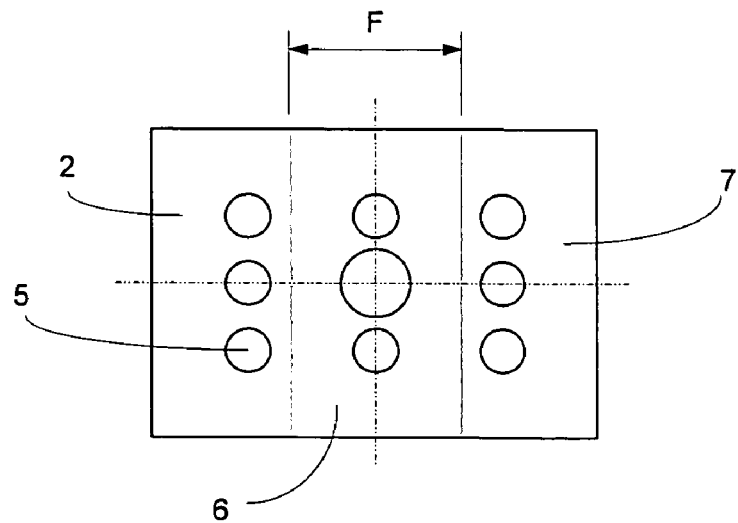
FIG. 2 is a diagrammatic sketch in a plan view showing the chip contacting surface of a bonding tool as in FIG. 1, having a flat region and convex regions.

FIG. 1 is a diagrammatic sectional view thru a chip bonding tool 1 in accordance with the invention. The chip bonding tool 1 includes a suction part 2 and a shank 3. The shank 3 has a conduit 4 extending from one terminal (first) end to the other terminal (second) end of the shank 3. In use, the conduit is employed for supplying a vacuum to the suction part 2. The second end of the shank 3 is shaped like a plate 8 that supports a suction part 2. A suction part 2 is made of an elastic material such as a rubber so that the impact power generated during the chip mounting process can be reduced effectively. FIG. 2 is a view from below of a suction part 2 as in FIG. 1. A flat zone or region is situated on the center of the suction part 2 and the chip contacting surface of the suction part 2 has openings 5 communicating with the conduit 4. The number of openings can be made greater or lesser, depending upon design considerations; the flat region and each convex region should have one opening 5. In the example of FIGS. 1 and 2, three openings are provided in the flat region 6 and in each convex region 7. Vacuum can be applied from the bottom of the opening 5 in the suction part 2 to the top of the conduit 4 in the shank 3 after the plate 8 of the shank 3 is fitted to the suction part 2 with accuracy as illustrated in FIG. 1 so that semiconductor chip 9 can be lifted.

According to the aspect of the invention shown in FIGS. 1 and 2, the surface 7 of the suction part 2 is shaped convex and also has a flat zone 6 in the center of the surface 7. The curvature of the curved surface 7 is defined by measuring the height difference (marked as a reference character H) between the beginning and the end of it and the degree of flatness is defined as the width (marked as a reference character F) of a flat zone 6. Steps in a process for picking up a semiconductor chip 9 are illustrated in sectional view in FIGS. 3A through 3D in process order. FIG. 3A shows a snapshot before a semiconductor chip 9 is picked up. Semiconductor chips 9 coated with the adhesive film 10 are carried on the wafer mounting film 11, which constitutes a chip carrier. While the chip bonding tool 1 is lowered, a flat zone 6 contacts a semiconductor chip 9 at first as shown in FIG. 3B. The first suction is generated through holes of a flat zone 6. While pressure is applied to the chip bonding tool 1 downward, the rubber suction part 2 is elastically deformed and then the whole lower surface of the suction part 2 fully contacts the semiconductor chip. As a result, a second suction is generated through the holes 5 of the curved surfaces 7. FIG. 3C shows this process. Since vacuum is formed on the whole area of a semiconductor chip 9 through two steps mentioned above, a pick-up process can be readily carried out. When the chip bonding tool 1 is lifted, both the suction part 2 and the lifted semiconductor chip 9 become convex due to elasticity of the suction part 2 as illustrated in FIG. 3D. Steps in a process for mounting a semiconductor chip 9 onto a substrate or a previously mounted chip 12 are illustrated in sectional view in FIGS. 4A and 4B.

As noted above, the step of pressing the bonding tool onto the chip entails applying a downward force (pressure) sufficient to deform the suction part adjacent the chip-contacting surface (the deformation zone). That is, the parts of the chip-contacting surface surrounding the openings must make secure contact with the chip so that when vacuum is applied leakage is at least minimized, or avoided altogether. Particularly in embodiments in which the chip contacting surface of the suction part is at least partially convex, the force must be sufficient to flatten the chip-contacting surface onto the chip, and the deformation zone must be sufficiently elastically deformable so that, under the conditions of force (pressure) employed when the tool is pressed onto the chip, the chip contacting surface will flatten without damage to the chip. If the deformation zone is not sufficiently deformable, application of sufficient force to achieve the necessary flattening of the chip-contacting surface may damage the chip. On the other hand, if the deformation zone is too readily deformable, it may not hold a good seal against vacuum leakage when the contacting force is relieved; also, in embodiments in which the chip contacting surface is at least partially convex, the suction part may not provide a desirable flexion of the chip when the chip is lifted. Appropriate deformability can be determined by consideration of the dimensions and the flexibility of the particular chip, and upon the configuration of the deformation zone and the chip-contacting surface.

As may be appreciated from the foregoing, the force required to flatten the deformation zone of the suction part in a particular configuration depends upon the material of which the deformation zone is made, and upon the size and number of the openings through it. For a given configuration of openings a material having a greater bulk modulus will be less readily deformable. Generally, suitable materials for the suction part (or at least for the portion of the suction part that constitutes the deformable zone), include elastic polymers, preferably polymers that are not degraded by the conditions of use. Examples of suitable polymers include, for example, silicone-based polymers.

On mounting a lifted semiconductor chip onto the surface of a substrate or another chip mounted previously 12, the center of the already lifted semiconductor chip reaches the surface first. As the chip bonding tool 1 is pressed downward, the rubber suction part 2 and the picked semiconductor chip are elastically deformed to the flat surface. The pressure builds up from the center of the suction part 2 outwards. In doing so, the semiconductor chip is rolled onto the surface of the substrate or previously mounted chip 12, whereby the air can continuously escape. As a result, there is no trapped air in the contact line between the surface of the chip and the surface of the substrate or previously-mounted chip.

Another embodiment according to the invention is shown diagrammatically in FIGS. 5A and 5B. Here the chip bonding tool has a suction part 52 whose chip contacting surface 56 is flat overall. As in the embodiment of FIGS. 1 and 2, the suction part is made of a resilient material. Openings 55, communicating with a conduit 54 in the shank 53, are distributed in a uniform array on the flat surface 56. As will be appreciated, a much thinner semiconductor chip can be more vulnerable to cracking when bent. Therefore, in instances where a very thin semiconductor chip is picked and mounted on a substrate or previously mounted chip, use of a tool having a flat chip contacting surface (or at least a flatter surface) as in FIGS. 5A and 5B may be preferred.

Another embodiment according to the invention is shown diagrammatically in FIGS. 6A and 6B. Here the chip bonding tool has a suction part 62 whose chip contacting surface 66 is convex overall, with no flat region. The curvature of the curved surface 67 is defined by measuring the height difference (marked as a reference character $H_c$). As in the embodiment of FIGS. 1 and 2, and FIGS. 5A and 5B, the suction part 62 is made of a resilient material. Openings 65, communicating with a conduit 64 in the shank 63, are distributed in a uniform array on the flat surface 66. Particularly, at least one opening 65 should be placed each on the centerline of the convex chip contacting surface 67 (i.e. at or near the line in the surface that first contacts the chip to be picked up), and at least one opening should be placed in the centerline in the area of the surface edges. The number and distribution of openings can be determined according to design considerations, as noted above with reference to FIGS. 1 and 2. It should be noted that if the height difference $H_c$ of a curved surface 67 is too great, it can be difficult to effect pickup of the semiconductor chip 9 during the pick-up process, owing to a vacuum leakage in sides of the surface 67. In this case, therefore, a curvature height $H_c$ in a range between about 10 um and about to 400 um may be recommended. Preferred curvatures will depend among other factors on the flexibility and footprint dimensions of the die and upon the particular arrangement of openings near the margins of the chip contacting surface.

Other embodiments are within the following claims.

What is claimed is:

1. A semiconductor chip suction tool, comprising:
   a shank having a conduit for drawing a vacuum from a first end of the shank; and
   a suction part disposed on a second end of the shank and having a chip contacting surface, the chip contacting surface having a flat portion proximate to a center area of the suction part and a convex portion extending from the flat portion to an outer area of the suction part, the suction part further including an opening on the flat portion and openings on the convex portion, the openings providing pneumatic communication between the conduit of the shank and the chip contacting surface, wherein the suction part is elastically deformable so that the convex portion and associated openings flatten to be planar with the flat portion upon application of pressure to the shank.

2. The semiconductor chip suction tool of claim 1, wherein the suction part is made with a polymer.

3. The semiconductor chip suction tool of claim 2, wherein the polymer is a silicone-based material.

4. The semiconductor chip suction tool of claim 1, wherein the openings are distributed over the chip contacting surface.

5. The semiconductor chip suction tool of claim 1, wherein the outer area of the suction part returns to a convex shape upon removal of the pressure to the shank.

6. The semiconductor chip suction tool of claim 5, wherein a semiconductor chip attaches to the chip contacting surface when the vacuum and pressure are applied and conforms to the convex shape of the chip contacting surface upon removal of the pressure to the shank.

7. A semiconductor die suction tool, comprising:
   a shank having a conduit for drawing a vacuum from a first end of the shank; and
   a suction part disposed on a second end of the shank and having a die contacting surface, the die contacting surface having a convex surface with a plurality of openings providing pneumatic communication between the conduit of the shank and the die contacting surface, wherein the suction part is elastically deformable so that the convex surface and openings flatten upon application of pressure to the shank.

8. The semiconductor die suction tool of claim 7, wherein the die contacting surface has a flat portion proximate to a center area of the suction part and a convex portion extending from the flat portion to an outer area of the suction part.

9. The semiconductor die suction tool of claim 8, wherein the suction part further includes an opening on the flat portion.

10. The semiconductor die suction tool of claim 7, wherein the suction part is made with a polymer.

11. The semiconductor die suction tool of claim 10, wherein the polymer is a silicone-based material.

12. The semiconductor die suction tool of claim 7, wherein the openings are distributed over the die contacting surface.

13. The semiconductor die suction tool of claim 7, wherein the outer area of the suction part returns to a convex shape upon removal of the pressure to the shank.

14. The semiconductor die suction tool of claim 13, wherein a semiconductor die attaches to the die contacting surface when the vacuum and pressure are applied and conforms to the convex shape of the die contacting surface upon removal of the pressure to the shank.

15. A semiconductor die suction tool, comprising a shank and a suction part with a die contacting surface, the die contacting surface having a convex surface with a plurality of openings providing pneumatic communication between a conduit of the shank and the die contacting surface, wherein the suction part is elastically deformable so that the convex surface and openings flatten upon application of pressure to the shank.

16. The semiconductor die suction tool of claim 15, wherein the die contacting surface has a flat portion proximate to a center area of the suction part and a convex portion extending from the flat portion to an outer area of the suction part.

17. The semiconductor die suction tool of claim 16, wherein the suction part further includes an opening on the flat portion.

18. The semiconductor die suction tool of claim 15, wherein the suction part is made with a polymer.

19. The semiconductor die suction tool of claim 18, wherein the polymer is a silicone-based material.

20. The semiconductor die suction tool of claim 15, wherein the openings are distributed over the die contacting surface.

21. The semiconductor die suction tool of claim 15, wherein the convex surface to a convex shape upon removal of the pressure to the shank.

22. The semiconductor die suction tool of claim 21, wherein a semiconductor die attaches to the die contacting surface when vacuum and pressure are applied and conforms to the die contacting surface upon removal of the pressure to the shank.

* * * * *

UNITED STATES PATENT AND TRADEMARK OFFICE
CERTIFICATE OF CORRECTION

PATENT NO. : 7,650,688 B2.
APPLICATION NO. : 10/977047
DATED : January 26, 2010

Page 1 of 1

It is certified that error appears in the above-identified patent and that said Letters Patent is hereby corrected as shown below:

Column 6, Claim 7, line 18 through 25, change to read:

-- a suction part disposed on a second end of the shank and having a die contacting surface, the die contacting surface having a flat portion proximate to a center area of the suction part and a convex portion extending from the flat portion to an outer area of the suction part, the convex surface having a plurality of openings providing pneumatic communication between the conduit of the shank and the die contacting surface, wherein the suction part is elastically deformable so that the convex surface and openings flatten upon application of pressure to the shank. --

Column 6, Claim 15, line 48 through 55, change to read:

-- A semiconductor die suction tool, comprising a shank and a suction part with a die contacting surface, the die contacting surface having a flat portion proximate to a center area of the suction part and a convex portion extending from the flat portion to an outer area of the suction part, the convex surface having a plurality of openings providing pneumatic communication between a conduit of the shank and the die contacting surface, wherein the suction part is elastically deformable so that the convex surface and openings flatten upon application of pressure to the shank. --

Signed and Sealed this

Sixteenth Day of November, 2010

David J. Kappos
*Director of the United States Patent and Trademark Office*